(12) United States Patent
Im

(10) Patent No.: US 6,684,357 B2
(45) Date of Patent: Jan. 27, 2004

(54) CHIP TESTING APPARATUS AND METHOD

(75) Inventor: Jin Seok Im, Seoul (KR)

(73) Assignee: LG Electronics Inc., Seoul (KR)

( * ) Notice: Subject to any disclaimer, the term of this patent is extended or adjusted under 35 U.S.C. 154(b) by 434 days.

(21) Appl. No.: 09/734,600

(22) Filed: Dec. 13, 2000

(65) Prior Publication Data

US 2001/0004760 A1 Jun. 21, 2001

(30) Foreign Application Priority Data

Dec. 20, 1999 (KR) .......................................... 99-59493

(51) Int. Cl.$^7$ ............................................... G01R 31/28
(52) U.S. Cl. ....................... 714/732; 714/736; 714/733; 714/738; 714/734
(58) Field of Search .......................... 348/180; 714/732, 714/733, 724, 29, 720, 727, 736, 739, 30; 371/25, 22.4, 22.5; 395/200.77; 365/201

(56) References Cited

U.S. PATENT DOCUMENTS

| | | | | |
|---|---|---|---|---|
| 4,635,261 A | * | 1/1987 | Anderson et al. .............. | 371/25 |
| 5,230,000 A | * | 7/1993 | Mozingo et al. ............ | 371/22.4 |
| 5,528,602 A | * | 6/1996 | West et al. .................. | 371/22.4 |
| 5,764,655 A | * | 6/1998 | Kirihata et al. ............. | 371/22.5 |
| 5,832,235 A | * | 11/1998 | Wilkes ................... | 395/200.77 |
| 6,281,929 B1 | * | 8/2001 | Fimoff ......................... | 348/180 |
| 6,400,400 B1 | * | 6/2002 | Isnardi et al. ............... | 348/180 |

FOREIGN PATENT DOCUMENTS

KR    1998-39087    4/1999

* cited by examiner

*Primary Examiner*—Albert Decady
*Assistant Examiner*—Dipakkumar Gandhi
(74) *Attorney, Agent, or Firm*—Birch, Stewart, Kolasch & Birch, LLP

(57) ABSTRACT

A chip testing apparatus and method including a testing section, provided in a corresponding chip, for judging a normal/abnormal state of the corresponding chip by obtaining a test signature by accumulating a bit stream inputted in a system level using a predetermined testing method and by comparing the obtained test signature with a reference signature previously obtained and stored to verify the fault of the chip itself in the system level conveniently and rapidly. According to the chip testing apparatus and method, the fault that may be overlooked during the chip fabrication process can be discriminated, and thus a stable chip can be provided in implementing the whole system. Also, since it is prevented that the fault of the chip itself is wrongly detected as an error of the system construction, the shortening of the system development period and the improvement of the system performance can be achieved.

17 Claims, 2 Drawing Sheets

CHIP TESTING APPARATUS AND METHOD

BACKGROUND OF THE INVENTION

1. Field of the Invention

The present invention relates to a chip test, and more particularly to an apparatus and method of testing a video decoder in a system level.

2. Description of the Related Art

Generally, the fabrication of an application specific integrated circuit (ASIC) chip includes a chip testing process. This testing process is briefly divided into a process of checking whether the chip logic is correctly implemented, and a process of checking whether the actual chip function is correctly implemented.

Such a chip test is for confirming whether or not a correct output pattern comes out with respect to a determined input pattern. At this time, since the quantity and the scale of the input pattern are closely related to the unit cost of the chip, the testing process is performed for the minimum amount of the input pattern.

Accordingly, due to the limitation of the amount of pattern to be tested, the fault of the chip may not be sometimes found.

In the event that a system is constructed using the ASIC chip fabricated without finding out the fault thereof in the above-described testing process, the system may malfunction, and it is difficult to grasp which IC contains the fault if an error occurs in the system due to the fault of the chip.

SUMMARY OF THE INVENTION

Accordingly, the present invention is directed to a chip testing apparatus and method that substantially obviates one or more of the problems due to limitations and disadvantages of the related art.

An object of the present invention is to provide a chip testing apparatus and method which can confirm in the system level whether or not any fault exists in the chip itself overlooked in the process of fabricating the ASIC chip.

Another object of the present invention is to provide a chip testing apparatus and method which can confirm the error occurring in the system board using the judgement result of the chip fault in the system level.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the chip testing apparatus in a system constructed using at least one chip, includes a testing section, provided in the corresponding chip, for judging a normal/abnormal state of the corresponding chip by obtaining a test signature by accumulating a bit stream inputted in a system level using a predetermined testing method, and by comparing the obtained test signature with a reference signature previously obtained and stored.

In another aspect of the present invention, there is provided a video decoder comprising a video decoding section for receiving and decoding a video bit stream to be tested in a system level, and a testing section for discriminating a normal/abnormal state of the video decoding section by obtaining a test signature by accumulating video-decoded pixel values using a predetermined testing method, and by comparing the obtained test signature with a reference signature previously obtained and stored.

According to the present invention, the testing section obtains the test signature by accumulating the input bit stream through a check-summing process using a simple adder.

According to the present invention, the testing section obtains the test signature by accumulating the input bit stream by a multiple input shift register (MISR) using a shift register.

According to the present invention, the testing section comprises a test control section for controlling a testing operation by determining a test mode in accordance with an input test method, test unit, and bit width, an operation section for outputting the test signature by accumulating the pixel values decoded and inputted in accordance with the test mode determined by the test control section, a comparator for comparing the test signature outputted from the operation section with a pre-stored reference signature under the control of the test control section to output a result of comparison, and a host control section for obtaining and storing the reference signature to be used for the test, outputting to the test control section the test method, test unit, and bit width at that time, and judging whether the corresponding chip is in the normal or abnormal state in accordance with the comparison result of the comparator to enable a tester to recognize a result of judgement.

According to the present invention, the test unit used for the accumulation is the unit of a picture or of a sequence.

In still another aspect of the present invention, there is provided a chip testing method in a system constructed using at least one chip, comprising the steps of receiving and decoding a video bit stream to be tested in a system level, and discriminating whether the corresponding chip is in a normal or abnormal state by obtaining a test signature by accumulating video-decoded pixel values using a predetermined testing method, and by comparing the obtained test signature with a reference signature previously obtained and stored.

According to the present invention, the step of discriminating the normal/abnormal state of the chip obtains the test value by selecting one of a check-summing process using a simple adder and a multiple input shift register (MISR) process using a shift register as the testing method, and accumulating the pixel values outputted at the video decoding step accordingly.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
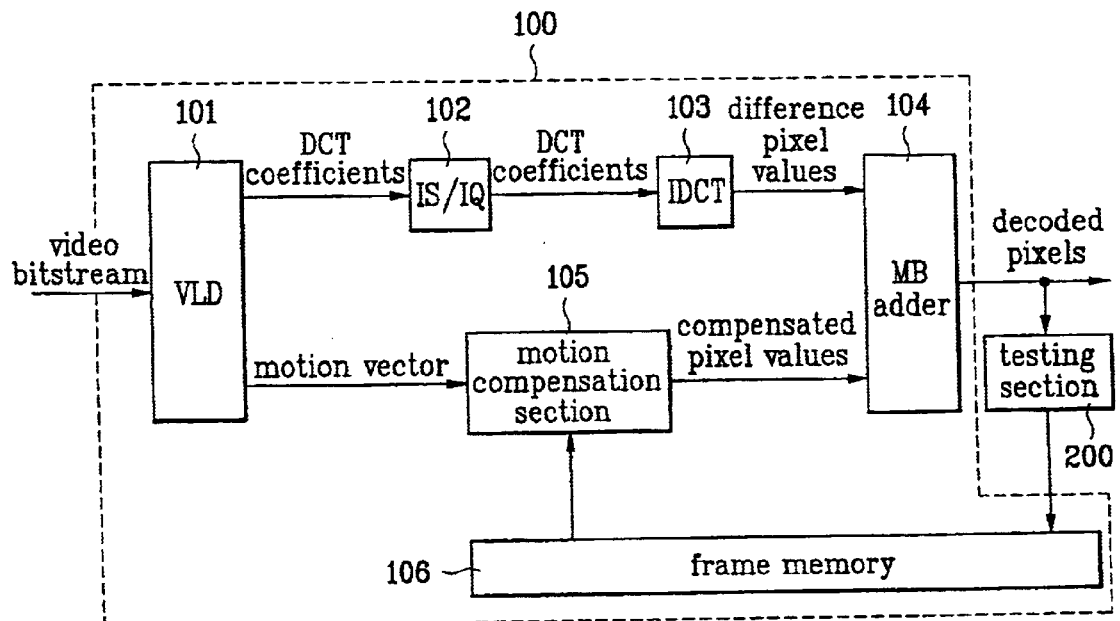
FIG. 1 is a block diagram illustrating the construction of a video decoder having a chip testing apparatus according to the present invention.

FIG. 1 is a block diagram illustrating the construction of a video decoder having a chip testing apparatus in a system level according to the present invention.

Referring to FIG. 1, the video decoder includes a video decoding section 100 and a testing section 200 for detecting the fault of the video decoding section 100. Here, the video decoding section 100, that is well known in the art, comprises a variable length decoder (VLD) 101, an inverse scan/inverse quantizer (IS/IQ) section 102, an inverse discrete cosine transform (IDCT) section 103, an adder 104, a motion compensation section 105, and a frame memory 106.

The video decoding section 100 has two blocks for a data path. One is a path for compensating for the current pixel values through estimation from the pixel values of the previous frame using motion vectors, and the other is a path for IDCT-transforming again the DCT coefficients for the differences among the pixel values that cannot be represented by the motion compensation.

Specifically, the input video bit stream is variable-length-decoded by the VLD 101, and is divided into motion vectors, quantized values, and DCT coefficients. The values corresponding to the DCT coefficients among the outputs of the VLD 101 are inputted to the IDCT section 103 after passing through the IS/IQ section 102.

At this time, the DCT coefficients are decoded in a run level by the VLD 101. That is, one DCT block is composed of coefficients of 8×8, and since only the coefficients which are not "0" are inserted in the code, the VLD 101 outputs the size, i.e., level of the coefficients which are not "0", and a run that is a value representing how many "0"s are inserted among the coefficients. Also, the decoding order of the 8×8 coefficients is determined typically in a zigzag manner so that a low-frequency component is first transmitted to heighten the efficiency of the run length code.

Accordingly, the IS/IQ section 102 inverse-scans in a raster scan manner the zigzag scan type (or alternate scan type) DCT coefficients, and then inverse-quantizes the inverse-scanned DCT coefficients according to the quantized values to output inverse-quantized DCT coefficients to the IDCT section 103. The IDCT section 103 performs an IDCT with respect to the inverse-quantized DCT coefficients, and outputs the IDCT-transformed coefficients to the macro block (MB) adder 104.

Meanwhile, motion vectors outputted from the VLD 101 are inputted to the motion compensation section 105, and the motion compensation section 105 performs the motion compensation with respect to the current pixel values using the motion vectors and the previous frame stored in the frame memory 106 to output motion-compensated values to the MB adder 104.

The MB adder 104 restores and outputs for display the complete image that corresponds to the final pixel values by adding the IDCT-transformed values and the motion-compensated values, and simultaneously stores the final pixel values in the frame memory 106 through the testing section 200.

The testing section 200 confirms whether the blocks related to the video decoding and the data paths are correctly operating using the video-decoded pixel values.

Specifically, the testing section 200 obtains the test signature by accumulating the video-decoded pixel values by a determined testing method, and compares it with the reference signature previously obtained by simulation to confirm the normal/abnormal state of the pixel values. This is because the correct pixel values are obtained only when the VLD 101, IS/IQ section 102, IDCT section 103, motion compensation section 105, MB adder 104, and memory 106 are normally implemented. Accordingly, if the pixel values are outputted as the expected values, it can be judged that the whole data paths and blocks in the video decoding section 100 are correctly implemented.

Figure 2:
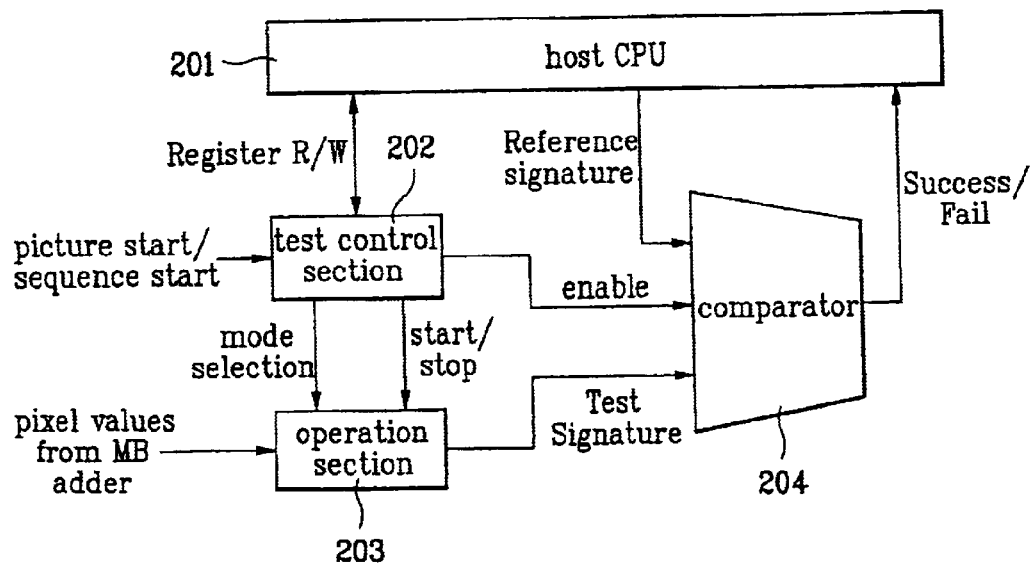
FIG. 2 is a block diagram illustrating the detailed construction of the testing section of FIG. 1.

FIG. 2 is a block diagram illustrating the detailed construction of the testing section of FIG. 1. Referring to FIG. 2, the testing section comprises a host control section (hereinafter referred to as a CPU) 201 for controlling the testing process, a test control section 202 for determining a test mode in accordance with the control of the host CPU 201 and the test unit inputted from the outside, an operation section 203 for obtaining the test signature for comparison by accumulating the decoded pixel values in accordance with the test mode determined by the test control section 202 and a start/stop signal, and a comparator 204 for comparing the reference signature outputted from the host CPU 201 with the test signature outputted from the operation section 203, and outputting a result of comparison to the host CPU 201.

In order to test in the system level whether the ASIC chip, for example, the video decoder chip, is correctly implemented, the host CPU 201 sets the testing method to be performed by the operation section 203, the reference signature at that time, etc.

At this time, it will be one of the most accurate comparison methods to compare the original image with the decoded image with respect to all the luminance values and chrominance values which constitute one image frame. However, a high-definition (HD) image typically has a frame size of 1920*1080, and thus the test is performed with respect to pixel values of 1920*1080*3 (here, 3 refer to R, G, and B colors)=6220900. This requires an exorbitant effort and time, and thus is very inefficient.

In order to perform the test more efficiently and in a short time, the operation section 203 according to the present invention uses as the testing method the check sum or the multiple input shift register (MISR) signature which has a great reliability.

That is, the present invention uses the method of obtaining the signature using the MISR in addition to the method of obtaining the check sum using a simple adder as the accumulation method for the chip test.

Also, the test unit may be the unit of a picture or the unit of a sequence by selection. According to the testing method, the bit width of the signature can also be selected to be either 8 bits or 32 bits. Here, since one pixel is composed of 8 bits, and the video decoding is performed in the unit of 4 bytes, i.e., 32 bits, that is the unit for the memory control, either the 8 bits or 32 bits may be selected as the bit width.

The above-described case is just an example, and the testing method, test unit, and bit width may be differently determined by a designer.

Meanwhile, the check sum is a method of accumulating the data decoded in the selected test unit, i.e., for a picture or for a sequence, using the simple adder. At this time, the check sum can be obtained using a 8-bit adder or 32-bit adder in accordance with the selection of the bit width of the signature.

In a mode that the addition is performed for a picture using the 8-bit adder, for instance, all the luminance and chrominance signal values for a picture are added in the unit of a bit, and at this time, carries are dumped. The value resultant from the above process, i.e., the 8-bit value is called the signature.

Meanwhile, the MISR is a method of accumulating the data decoded in the selected test unit, i.e., for a picture or for a sequence using the shift register. This method is more accurate than the check sum. The MISR is a kind of adder composed of a shift register.

Figure 3:
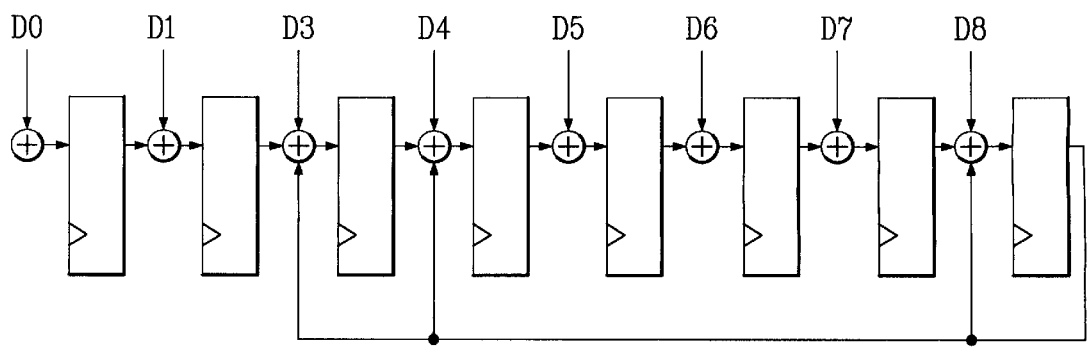
FIG. 3 is a block diagram illustrating an example of the operation section of FIG. 2 that is composed of the MISR.

FIG. 3 is a block diagram illustrating an example of the 8-bit MISR, which is mainly used for checking the normal/abnormal state of parallel data.

For instance, if the bit width of the MISR is 8 bits as shown in FIG. 3, the number of sets of the signature is $2^8-1$ (i.e., the case that all bits are "0" is excluded), and the error mask probability that the signature is not included in a correct set is $2^{-8}$. On the contrary, the probability of finding out an error is quite high, i.e., it is about $100*(1-2^{-8})=99.61\%$. Here, the error mask probability is the probability that the different images have the same signature, i.e., the same value.

At this time, the shift register for implementing the MISR may be used as a register whereby the results are accumulated. Also, the shift register may be used as a register for storing the result of addition in the check-sum mode.

The register is enabled by the start signal of the test control section 202, and stops by the stop signal thereof. The register passes the result to the comparator 204 to verify the normal/abnormal state of the chip.

At this time, the respective reference value for the respective test method, test unit, and bit width, i.e., the reference signature, is predetermined and stored in the host CPU 201. For example, if the correct signature is obtained by performing by simulation with respect to the image to be tested by the check sum for a picture in the unit of 8 bits, the reference signature at this time as well as the check-sum method as the testing method, unit of a picture as the test unit, and 8 bits as the bit width, is stored.

The above process may be performed with respect to the respective testing method, test unit, and bit width. Also, the testing method, test unit, and the bit width may be first determined, and then the above process may be performed with respect to the determined testing method, test unit, and bit width.

Meanwhile, if the testing method, test unit, and bit width are determined through the above-described process, the test control section 202 determines the test mode. For example, it is determined whether the test signature is obtained by the 8-bit check sum method for a picture, by the 32-bit check sum method for a picture, or the 8-bit MISR method for a sequence.

If the test mode is determined, the test control section 202 outputs to the operation section 203 the test start signal along with the test mode signal in accordance with the externally inputted picture start signal or sequence start signal.

The operation section 203 operates the pixel values outputted from the adder 104 in accordance with the test mode. Here, the pixel values include both the luminance and the chrominance signals. For example, if the test mode is the mode that the signature is obtained by the 8-bit check sum method, the operation section 203 accumulates the pixel values inputted through the 8-bit check sum method for a picture under the control of the test control section 202.

When the accumulation for a picture is completed, the test control section 202 outputs the stop signal to the operation section 203 to stop the accumulation process, and simultaneously outputs the enable signal to the comparator 204.

At this time, if the accumulation is stopped by the stop signal, the operation section 203 outputs the result of accumulation, i.e., the test signature to the comparator 204.

The comparator 204, when it is enabled by the enable signal from the test control section 202, compares if the reference signature inputted through the host CPU 201 is identical to the test signature outputted from the operation section 203, and outputs the result of comparison to the host CPU 201. If the two values are identical, the host CPU 201 judges a success, while if not, the host CPU 201 judges a fail, and makes the tester recognize the result of judgement.

In other words, the host CPU 201 completes the verification by inputting the determined bit stream after starting the test mode, and comparing only the signatures of the compressed and determined sizes (i.e., 8, 16, or 32 bits).

Meanwhile, in another embodiment of the present invention, the test signature may be obtained from one among the outputs of the VLD 101, IS/IQ section 102, IDCT section 103, and motion compensation section 105 in the event that the test signature is in the form of a bit stream. Also, if the present invention is applied to the DTV receiver as shown in FIG. 4, the normal/abnormal state of the system board can also be confirmed.

Figure 4:
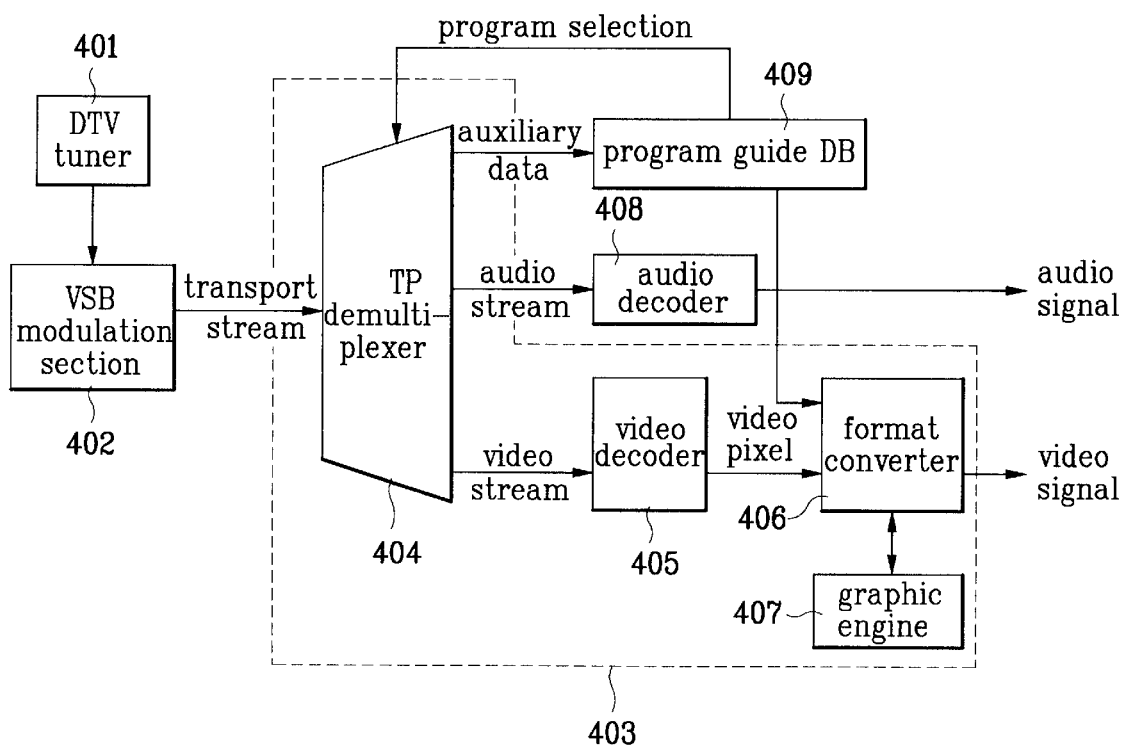
FIG. 4 is a block diagram illustrating the construction of a DTV receiver provided with the video decoder of FIG. 1.

FIG. 4 is a block diagram illustrating the construction of a DTV receiver. Referring to FIG. 4, it is assumed that the chip testing apparatus according to the present invention is provided in the video decoder 405 if the ASIC one-chip 403 is composed of a transport demultiplexer (TP) 404, a video decoder (VDEC) 405, a format converter (FC) 406, and a graphic engine (GFX) 407.

Specifically, the video bit stream separated by the transport demultiplexer 404 is inputted to the video decoder 405, and is decoded by an MPEG algorithm as shown in FIG. 1. Then, the normal/abnormal state of the transport demultiplexer 404 and the video decoder 405 is discriminated by obtaining the signature by the check sum or the MISR with respect to the decoded pixel values as shown in FIG. 2, and then comparing the obtained signature with the estimated result, i.e., the reference signature.

At this time, the normal/abnormal state of the system board can also be recognized through the testing process after the ASIC one-chip 403, which has separately tested and discriminated as the success, is mounted on the DTV receiver. Specifically, if the test result of the separate ASIC one-chip 403 is the success, the ASIC one-chip 403 is mounted on the DTV receiver, and then the test is reperformed. It is judged that the system board is in a normal state if the test result is the success, while the system board is in an abnormal state if the test result is the fail.

The present invention can also be applicable to not only the video decoder but also to an audio decoder or decoding of auxiliary data.

As described above, according to the chip testing apparatus and method according to the present invention, since the fault of the chip itself in the system level can be conveniently and rapidly verified, the fault that may be overlooked during the chip fabrication process can be discriminated, and thus a stable chip can be provided in implementing the whole system. Also, since it is prevented that the fault of the chip itself is wrongly grasped as an error of the system construction, the shortening of the system development period and the improvement of the system performance can be achieved. Also, the test can be performed more efficiently and flexibly since the present invention has various modes that can be selected.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A chip testing apparatus in a system constructed using at least one chip, comprising:
    a testing section, provided in the corresponding chip, for judging a normal/abnormal state of the corresponding chip by obtaining a test signature by accumulating a bit stream inputted in the system level using a predetermined testing method, and by comparing the obtained test signature with a reference signature previously stored,
    wherein the testing section comprises:
        a test control section for controlling a testing operation by determining a test mode in accordance with an input test method, and an input test unit, and an input bit width;
        an operation section for outputting the test signature by accumulating pixel values decoded and inputted in accordance with the test mode determined by the test control section;
        a comparator for comparing the test signature outputted from the operation section with a pre-stored reference signature under the control of the test control section to output a result of the comparison; and
        a host control section for determining variably the reference signature to be used for the test based on the input test method, the input test unit and the input bit width, storing the determined reference signature, and judging whether the corresponding chip is in the normal or abnormal state in accordance with the comparison result of the comparator.

2. The chip testing apparatus as claimed in claim 1, wherein the testing section obtains the test signature by accumulating the input bit stream through a check-summing process using an adder.

3. The chip testing apparatus as claimed in claim 1, wherein the testing section obtains the test signature by accumulating the input bit stream by a multiple input shift register (MISR) using a shift register.

4. The chip testing apparatus as claimed in claim 1, wherein the test unit used for the accumulation is the unit of a picture.

5. The chip testing apparatus as claimed in claim 1, wherein the test unit used for the accumulation is the unit of a sequence.

6. The chip testing apparatus as claimed in claim 1, wherein a normal/abnormal state of a system board is discriminated by mounting on a system the corresponding chip that has been discriminated as a success through the testing process, and then reperforming the testing process.

7. A video decoder comprising:
    a video decoding section for receiving and decoding a video bit stream to be tested in a system level; and
    a testing section for discriminating a normal/abnormal state of the video decoding section by obtaining a test signature by accumulating video-decoded pixel values using a predetermined testing method, and by comparing the obtained test signature with a reference signature previously stored,
    wherein the testing section comprises:
        a test control section for controlling a testing operation by determining a test mode in accordance with an input test method, an input test unit, and an input bit width;
        an operation section for outputting the test signature by accumulating the pixel values decoded and inputted in accordance with the test mode determined by the test control section;
        a comparator for comparing the test signature outputted from the operation section with a prestored reference signature under the control of the test control section to output a result of the comparison; and
        a host control section for determining variably the reference signature to be used for the test based on the input test method, the input test unit and the input bit width, storing the determined reference signature, and judging whether the video decoding section is in the normal or abnormal state in accordance with the comparison result of the comparator.

8. The video decoder as claimed in claim 7, wherein the operation section obtains the test signature by accumulating the pixel values outputted from the video decoding section through a check-summing process using an adder.

9. The video decoder as claimed in claim 8, wherein the test unit used for the accumulation is the unit of a picture or the unit of a sequence.

10. The video decoder as claimed in claim 8, wherein the bit width used for the accumulation is one among $2^n$ (n is a natural number) bits.

11. The video decoder as claimed in claim 7, wherein the operation section obtains the test signature by accumulating the pixel values outputted from the video decoding section through a multiple input shift register (MISR) process using a shift register.

12. The video decoder as claimed in claim 11, wherein the test unit used for the accumulation is the unit of a picture or the unit of a sequence.

13. The video decoder as claimed in claim 11 wherein the bit width used for the accumulation is one among $2^n$ (n is a natural number) bits.

14. A chip testing method in a system constructed using at least one chip, comprising the steps of:
    receiving and decoding a video bit stream to be tested in a system level; and
    discriminating whether the corresponding chip is in a normal or abnormal state by obtaining a test signature by accumulating video-decoded pixel values using a predetermined testing method, and by comparing the obtained test signature with a reference signature previously stored,
    wherein the step of discriminating whether the chip is in the normal/abnormal state comprises:
        a test control step of controlling a testing operation by determining a test mode in accordance with an input test method, an input test unit, and an input bit width;
        an operation step of outputting the test signature by accumulating the pixel values decoded and inputted in accordance with the test mode determined by the test control step;
        a comparison step of comparing the test signature outputted from the operation step with a pre-stored reference signature under the control of the test control step to output a result of the comparison; and a host control step of determining variably the reference signature to be used for the test based on the input test method, the input test unit and the input bit width, storing the determined reference signature, and judging whether the corresponding chip is in the normal or abnormal state in accordance with the comparison result of the comparison step.

15. The chip testing method as claimed in claim 14, wherein the step of discriminating the normal/abnormal state of the chip obtains the test value by selecting one of a check-summing process using an adder and a multiple input shift register (MISR) process using a shift register as the testing method, and accumulating the pixel values outputted at the video decoding step accordingly.

16. The chip testing method as claimed in claim 14, wherein the test unit is either the unit of a picture or the unit of a sequence.

17. The chip testing method as claimed in claim 14, wherein the bit width is either 8 bits or 32 bits.

* * * * *